United States Patent

Ohura et al.

[11] Patent Number: 6,162,319
[45] Date of Patent: Dec. 19, 2000

[54] PRESSURE-SENSITIVE ADHESIVE HAVING EXCELLENT HEAT RESISTANCE AND HEAT CONDUCTIVITY, ADHESIVE SHEETS, AND METHOD OF SECURING ELECTRONIC COMPONENT TO HEAT-RADIATING MEMBER THEREWITH

[75] Inventors: Masahiro Ohura; Shigeki Muta; Takao Yoshikawa, all of Osaka, Japan

[73] Assignee: Nitto Denko Corporation, Osaka, Japan

[21] Appl. No.: 09/194,180

[22] PCT Filed: May 28, 1997

[86] PCT No.: PCT/JP97/01812

§ 371 Date: Nov. 24, 1998

§ 102(e) Date: Nov. 24, 1998

[87] PCT Pub. No.: WO97/45499

PCT Pub. Date: Dec. 4, 1997

[30] Foreign Application Priority Data

May 30, 1996 [JP] Japan .................................. 8-136248

[51] Int. Cl.[7] .................................................. B32B 31/00
[52] U.S. Cl. .................. 156/273.3; 428/345; 522/71; 522/184; 522/186
[58] Field of Search ........................... 522/71, 184, 186; 428/345; 156/273.3

[56] References Cited

U.S. PATENT DOCUMENTS

| | | | |
|---|---|---|---|
| 3,725,115 | 4/1973 | Christenson et al. | 156/273.3 |
| 4,379,201 | 4/1983 | Heilmann et al. | 428/345 |
| 4,574,879 | 3/1986 | DeGree et al. | |
| 4,714,655 | 12/1987 | Bordoloi et al. | 428/345 |
| 4,869,879 | 9/1989 | Squitieri | |
| 4,908,296 | 3/1990 | Nebe et al. | 522/71 |
| 5,213,868 | 5/1993 | Liberty et al. | |
| 5,366,573 | 11/1994 | Bayer et al. | 156/273.3 |
| 5,462,977 | 10/1995 | Yoshikawa et al. | 428/345 |

FOREIGN PATENT DOCUMENTS

| | | |
|---|---|---|
| 0 566 093 A1 | 10/1993 | European Pat. Off. |
| 60-11574 | 1/1985 | Japan |
| 5-271624 | 10/1993 | Japan |
| 6-88061 | 3/1994 | Japan |

*Primary Examiner*—John J. Gallagher
*Attorney, Agent, or Firm*—Sughrue, Mion, Zinn, Macpeak & Seas, PLLC

[57] ABSTRACT

A pressure-sensitive adhesive excellent in the heat resistance and the heat-conductivity comprising a photopolymerization product of a composition containing a) 100 parts by weight of an acrylic monomer mixture or the partial polymerized product thereof, b) from 0.01 to 5 parts by weight of a polyfunctional (meth)acrylate as a crosslinking agent, c) from 10 to 300 parts by weight of a ceramic powder made up of a covalent bond substance having the total valence electron number of 8 and having a wurtzite type or zincblende type crystal structure or a substance of a hexagonal system or a graphite structure, and d) from 0.01 to 5 parts by weight of a photopolymerization initiator; an adhesive sheet using the pressure-sensitive adhesive; and a fixing method of electronic parts and heat-radiating members using them. By using the adhesive materials, electronic parts and heat-radiating members can be easily fixed by adhesion without requiring much time and large labor, and there is no fear that peeling and deterioration occur, even when they are subjected to a heat cycle of quick heating and quick cooling.

12 Claims, No Drawings

PRESSURE-SENSITIVE ADHESIVE HAVING EXCELLENT HEAT RESISTANCE AND HEAT CONDUCTIVITY, ADHESIVE SHEETS, AND METHOD OF SECURING ELECTRONIC COMPONENT TO HEAT-RADIATING MEMBER THEREWITH

TECHNICAL FIELD

The present invention relates to a pressure-sensitive adhesive excellent in the heat resistance and the heat conductivity and adhesive sheets prepared by forming the pressure-sensitive adhesive into the form of sheets and tapes, which are used for fixing electronic parts, in particular fixing electronic parts and heat-radiating members, and also for fixing other members in various fields of building materials, vehicles, airplanes, vessels, etc.

BACKGROUND ART

Because in electronic parts such as hybrid packages, multimodules, closed type integrated circuits with plastics or metals, etc., with the increase of the integration of integrated circuits, the heating value is increased and there is a possibility of causing functional disorders of electronic parts by the increase of temperature, measures of preventing the occurrence of the functional disorders by attaching heat-radiating members such as a heat sink, etc., to electronic parts are adopted.

For attaching heat-radiating members to electronic parts, a method of fixing by adhesion using an appropriate adhesive may be employed but the following problems are indicated. That is, in the case of using an adhesive prepared by a solution polymerization, a low-boiling organic solvent used at the production remains in the adhesive, and evaporation of the solvent causes corrosion of electronic parts or the evaporation and expansion of the solvent at high temperature cause swelling, peeling, and slipping. Also, in the case of using an adhesive prepared by an emulsion polymerization, an emulsifying agent used at the production thereof bleeds to cause staining, adhesion failure, and lowering of the moisture resistance.

On the other hand, recently, from the view point of safety and the environmental hygiene relating to the use of an organic solvent, photopolymerization-type acrylic pressure-sensitive adhesives are proposed. For example, in U.S. Pat. No. 4,181,752, a method of obtaining a pressure-sensitive adhesive without using an organic solvent, which comprises photopolymerizing an acrylic acid alkyl ester and a monomer for modification on a base material, is disclosed. Also, a pressure-sensitive adhesive prepared by forming the similar pressure-sensitive adhesive on a releasing liner and transferring the adhesive on a base material is known According to such a photopolymerization-type pressure-sensitive adhesive, it has been expected that the above-described various problems attributable to the use of an organic solvent or an emulsifying agent are all avoided, the molecular weight of the polymer obtained can be increased by irradiating a light having a relatively weak intensity, and a pressure-sensitive adhesive of good heat resistance having a large crosslinking degree and a large cohesive force can be obtained.

Also, the adhesive for attaching heat-radiating members to electronic parts is required to have an excellent heat-conductivity in addition to a high heat resistance.

From this point, for example, (a) an adhesive prepared by adding an aluminum powder to a composition containing a polymerizable acrylic acid ester monomer and a free radical initiator as described in U.S. Pat. No. 4,772,960, (b) a pressure-sensitive adhesive prepared by randomly dispersing a heat-conductive electrically insulating particles in an alkyl acrylate series polymer as described in European Patent (EP) 566093-A1, (c) an adhesive tape having an adhesive layer containing silver particles having the grain sizes larger than the thickness of the layer as described in U.S. Pat. No. 4,606, 962, etc., are proposed.

However, in the case of the adhesive of above-described (a), after applying the adhesive to one or both of an electronic part and a heat-radiating member, it is necessary to apply a curing treatment using a primer or by intercepting oxygen and thus there is a problem that a much time and a large labor are required for the adhesive treatment and also it is required to temporarily fix the adherends until the adhesive is cured, which reduces the production efficiency of electronic parts. Also, in the case of the adhesives, etc., of above-described (b) and (c), when the adhesive used is subjected to a heat cycle of quick heating and quick cooling, peeling and a deterioration are liable to occur and a satisfactory result is not always obtained for fixing by adhesion of electronic parts and heat-radiating members.

The present invention has been made under these circumstances and an object of the present invention is to provide a photopolymerization-type pressure-sensitive adhesive excellent in the heat resistance and the heat conductivity without causing the problems of the adhesive materials added with heat-conductive particles of above-described (a) to (c), that is to provide a pressure-sensitive adhesive excellent in the heat resistance and the heat conductivity and adhesive sheets prepared by forming the pressure-sensitive adhesive in the forms of sheets or tapes, which can easily fix by adhesion electronic parts and heat-radiating members without requiring much time and large labor for the adhering treatment and does not cause the problem of peeling, deterioration, etc., even when the adhesive materials are subjected to a heat cycle of quick heating and quick cooling. As a matter of course, the present invention is not limited to fix well electronic parts and heat-radiating members using the above-described adhesive materials but can give the same effect as above when the adhesive materials are used for fixing other parts or members than the above-described ones.

DISCLOSURE OF THE INVENTION

As the results of various investigations for solving the above-described objects, the inventors have discovered that by compounding a specific acrylic monomer mixture with specific ceramic powder and photopolymerizing the mixture, a photopolymerization-type pressure-sensitive adhesive excellent in the heat resistance and the heat conductivity, and adhesive sheets thereof are obtained, and by using the adhesive materials, electronic parts and heat-radiating members can be easily fixed without requiring much time and large labor by the good pressure-sensitive property and the objects to be fixed can be stably and certainly kept without causing peeling and deterioration even when the fixed objects are subjected to a heat cycle of quick heating and quick cooling after fixing, and have accomplished the present invention based on the discovery.

That is, according to an aspect of the present invention, there is provided a pressure-sensitive adhesive excellent in the heat resistance and the heat conductivity, comprising a photopolymerization product of a composition containing following four components a) to d):

a) 100 parts by weight of a monomer mixture (or the partial polymerization product thereof) made up of from 70 to 99% by weight of a (meth) acrylic acid alkyl ester wherein the carbon atom number of the alkyl group is from 2 to 14 on an average and from 30 to 1% by weight of a monoethylenically unsaturated monomer copolymerizable with the (meth)acrylic acid alkyl ester, b) from 0.01 to 5 parts by weight of a polyfunctional (meth)acrylate as a crosslinking agent, c) from 10 to 300 parts by weight of at least one kind of a ceramic powder selected from a covalent bond substance having a total valence electron number of 8 and having a wurtzite-type or zincblende-type crystal structure and a substance having a hexagonal system or graphite structure, and d) from 0.01 to 5 parts by weight of a photopolymerization initiator.

According to other aspect of the present invention, there is provided an adhesive sheet comprising a base material having one or both surfaces thereof the layer of the above-described pressure-sensitive adhesive.

According to still other aspect of the present invention, there is provided a fixing method of electronic parts and heat-radiating members, which comprises fixing by adhesion electronic parts and heat-radiating members via the above-described pressure-sensitive adhesive or pressure-sensitive sheet.

BEST MODES FOR CARRYING OUT THE INVENTION

The present invention is described in detail below.

In the composition of the present invention, the (meth) acrylic acid alkyl esters constituting the monomer mixture (or the partial polymerization product thereof) of the component a) are preferably monofunctional unsaturated (meth) acrylates of a non-tertiary alkyl alcohol, such as, for example, ethyl (meth)acrylate, butyl (meth)acrylate, isoamyl (meth)acrylate, n-hexyl (meth)acrylate, 2-ethylhexyl (meth)acrylate, isooctyl (meth)acrylate, isononyl (meth)acrylate, decyl (meth)acrylate, and dodecyl (meth)acrylate. In these monomers, one or more kinds of the (meth) acrylates wherein the average carbon atom number of the alkyl group is from 2 to 14 are used.

Also, the monoethylenically unsaturated monomer copolymerizable with the above-described (meth)acrylic acid ester is used to improve the adhesive property by introducing a functional group or a polar group and to improve the cohesive force and the heat resistance by controlling the glass transition temperature of the photopolymerization product. Such an unsaturated monomer includes, for example, (meth) acrylic acid, itaconic acid, sulfopropyl (meth)acrylate, a hydroxyalkyl (meth)acrylate, a cyanoalkyl (meth)acrylate, (meth)acrylamide, a substituted (meth) acrylamide, N-vinylcaprolactam, (meth)acrylonitrile, vinyl chloride, and diallyl phthalate. From these monomers, one or more kinds of the monomers are used according to the purposes.

In the monomer mixture (or the partial polymerization product thereof) of the component a), it is better that in the use proportion of the (meth)acrylic acid alkyl ester and the monoethylenically unsaturated monomer copolymerizable with thereof, the (meth)acrylic acid alkyl ester is from 70 to 99% by weight, and preferably from 85 to 97% by weight and the monoethylenically unsaturated monomer copolymerizable with thereof is from 30 to 1% by weight, and preferably from 15 to 3% by weight. By using these monomers in the use proportion, the adhesive property, the cohesive force, etc., of the pressure-sensitive adhesive made up of the photopolymerization product can be balanced well.

In the composition of the present invention, the polyfunctional (meth)acrylate as the crosslinking agent of the component b) is to increase the shearing strength of the pressure-sensitive adhesive and as the (meth)acrylate of a polyhydric alcohol, for example, trimethylolpropane tri(meth)acrylate, pentaerythritol tetra(meth)acrylate, 1,2-ethylene glycol di(meth)acrylate, and 1,6-hexanediol di(meth)acrylate are preferably used.

The polyfunctional (meth)acrylate is used in an amount of from 0.01 to 5 parts by weight, and preferably from 0.1 to 3 parts by weight to 100 parts by weight of the monomer mixture of the component a). In the range, in the case of a bifunctional (meth)acrylate, the amount can be increased and in the case of a trifunctional or higher functional (meth)acrylate, the amount: can be decreased. However, if the amount of the polyfunctional (meth)acrylate is less than 0.01 part by weight, the crosslinking degree after the photopolymerization cannot be sufficiently increased, while the amount thereof is more than 5 parts by weight, there is a possibility of lowering the adhesive force, which are undesirable.

In the composition of the present invention, as the ceramic powder of the component c), at least one kind of a covalent bond substance having a total valence electron number of 8 and having a wurtzite-type or zincblende-type crystal structure and a substance having a hexagonal system or a graphite structure is used. The former covalent bond substance includes diamond, c-BN, SiC, BeO, BP, AlN, etc., and the latter substance having a hexagonal system or a graphite structure includes hexagonal BN, graphite, etc.

Now, the term "total valence electron number" means the total electron number of the electrons existing in the outermost shell of each atom constituting the compound and, for example, obtained as follows. Diamond: 4+4=8, c-BN: 3+5=8, SiC: 4+4=8, BeO: 2+6=8, BP: 3+5=8, AlN: 3+5=8.

In general, heat is transmitted by electrons in a metallic bond substance and by phonons (lattice oscillation) in an ion bond substance and a covalent bond substance, such as ceramics. A heat resistance forms by an electron-phonon interaction in a metal and increases with the increase of temperature and forms by a phonon-phonon interaction and a phonon imperfection (impurities, lattice defect, grain boundary, etc.) in ceramics and does not depend on a temperature too much. Accordingly, as the adhesive used for fixing electronic parts and heat-radiating members, the adhesive containing a ceramic powder wherein the heat resistance is hard to be influenced by a temperature reliance and the heat conductivity of a wide temperature range can be expected is suitable as compared with adhesives containing metal powder. The present invention selectively uses the covalent bond substance or the substance having a hexagonal system or a graphite structure described above from the view point.

The ceramic powder of the component c) may have any desired form such as, for example, a spherical form, an acicular form, a flake form, a star form, etc. The selection of the form may be properly determined according to the rheology of the monomer mixture or the rheological property of the composition.

The particle sizes of the ceramic powder are usually from 0.5 to 250 $\mu$m, preferably from 1 to 100 $\mu$m, and more preferably from 5 to 30 $\mu$m.

Also, it is better that the thermal expansion coefficient of the ceramic powder is $5.0 \times 10^{-5}/°$ C. or lower, and preferably $1.0 \times 10^{-5}/°$ C. or lower.

When a temperature is raised, the atoms constituting a crystal are thermally oscillated, as the result thereof, the volume of the crystal is increased, the increase of the volume is observed as a thermal expansion, which reduces the dimensional stability of the pressure-sensitive adhesive made up of the photopolymerization product containing the crystal, and when the pressure-sensitive adhesive is subjected to a heat cycle of quick heating and quick cooling, peeling and deterioration are liable to occur. By defining the thermal expansion coefficient of the ceramic powder in the above-described range, the dimensional stability is improved and the problems of causing peeling and deterioration can be restrained.

It is better that the using amount of the ceramic powder of the component c) is from 10 to 300 parts by weight, and preferably from 20 to 120 parts by weight to 100 parts by weight of the monomer component of the component a). If the used amount of the ceramic powder is less than 10 parts by weight, the effect of imparting the heat conductivity by the addition of the ceramic powder is not sufficiently obtained, while if the used amount thereof is more than 300 parts by weight, the adhesive force is liable to be lost, the heat resistance is lowered, and further when the pressure-sensitive adhesive is subjected to a heat cycle of quick heating and quick cooling, inconveniences such as peeling, deterioration, etc., are liable to occur.

In the composition of the present invention, as the photopolymerization initiator as the component d), benzoin ethers such as benzoin methyl ether, benzoin isopropyl ether, etc.; substituted benzoin ethers such as anisoin methyl ether, etc.; substituted acetophenones such as 2,2-diethoxyactophenone, 2,2-dimethoxy-2-phenonacetophenone, etc.; substituted a-ketols such as 2-methyl-2-hydroxypropiophenone, etc.; aromatic sulfonyl chlorides such as 2-naphthalenesulfonyl chloride, etc.; photoactive oximes such as 1-phenone-1,1-propanedione-2-(o-ethoxycarbonyl)oxime, etc., are used. The photopolymerization initiator is used in an amount of from 0.01 to 5 parts by weight to 100 parts of the monomer mixture as the component a) for obtaining a good photopolymerization property arid good adhesive characteristics.

At the preparation of the composition of the present invention, first, the monomer mixture of the component a) is mixed with the photopolymerization initiator of the component d), the premixture is partially polymerized to provide a coatable syrupy product made up of a partial polymerization product having a viscosity of from about 500 to 5,000 c.p. Or the above-described premixture of the monomer mixture and the polymerization initiator may be mixed with a thixotropic agent such as fumed silica to provide a coatable syrupy product.

Then, by mixing the coatable syrupy product thus obtained with the polyfunctional (meth) acrylate as the crosslinking agent of the component b), the ceramic powder of the component c), and, if necessary, the additional photopolymerization initiator, a composition for photopolymerization is prepared. To the composition can be further added, if necessary, known various additives such as a filler, a pigment, an antioxidant, a tackifier resin, a flame retardant, etc., in the ranges of not disturbing the photopolymerization by the irradiation of ultraviolet rays.

In the present invention, the composition thus prepared is irradiated with ultraviolet rays to provide a photopolymerization product. The irradiation of ultraviolet rays is carried out in an oxygen-free atmosphere replaced with an inert gas such as a nitrogen gas, etc., or in a state where the composition is shielded from air by covering with a ultraviolet transmissible film. Ultraviolet rays are electromagnetic radiations having a wavelength range of from about 180 to 460 nm but electromagnetic radiations having wavelengths longer than or shorter than the above wavelength range may be used. As the ultraviolet source, a general ultraviolet irradiation apparatus such as a mercury arc, a carbon arc, a low-pressure mercury lamp, an intermediate-pressure mercury lamp, a high-pressure mercury lamp, a metal halide lamp, etc., is used. The intensity of the ultraviolet rays is properly determined by controlling the distance between the ultraviolet source and a substance to be irradiated or by controlling the voltage and usually it is preferred to use weak ultraviolet rays having an intensity of from 0.1 to 7 $mW/cm^2$ in view of the irradiation time (productivity).

The photopolymerization product obtained by the irradiation of ultraviolet rays has a sufficiently high molecular weight and also has a high cohesive force by the internal crosslinkage with the crosslinking agent of the component b). In the present invention, the photopolymerization product is used as the acrylic pressure-sensitive adhesive having a tackiness in a normal state and having a good heat resistance, and the pressure-sensitive adhesive has the feature of excellent in the heat conductivity and a cooling and heating cycle resistance by the existence of the ceramic powder of the component c).

The adhesive sheet of the present invention is prepared by forming the acrylic pressure-sensitive adhesive thus prepared on one surface or both surfaces of a base material and forming the base material having the layer into a sheet form or a tape form.

As the base material, a metal foil such as a copper foil, an aluminum foil, a stainless steel foil, a beryllium foil, etc., is preferably used as a material excellent in the heat resistance and the heat conductivity. Also, a sheet-form material made up of a polymer excellent in the heat conductivity, such as a heat-conductive silicone rubber, a plastic film such as a polyimide film, a polyester film, etc., a flame-retarding film, a non-woven fabric, etc., can be used.

The thickness of the base material is usually from about 12 $\mu$m to 4 mm and the thickness of the layer of the acrylic pressure-sensitive adhesive formed on the base material is usually from about 10 to 150 $\mu$m.

The production of the adhesive sheet of the present invention can be also carried out by forming the layer of the acrylic pressure-sensitive adhesive on a releasing liner by the method described above and thereafter transferring the layer onto one surface or both surfaces of the base material. Furthermore, without using a releasing liner, the base material is directly coated or impregnated with the composition for the photopolymerization and the composition thus coated or impregnated is irradiated with ultraviolet rays to form a photopolymerization product followed by heat-drying to produce the adhesive sheet. A proper method can be employed according to the kind, etc., of the base material.

In the present invention, for fixing electronic parts and heat-radiating members using the above-described sensitive adhesive or the adhesive sheet thereof, by interposing the adhesive material between an electronic part and a heat-radiating member and a press-adhering treatment may be carried out utilizing the pressure-sensitive adhesive property, whereby both adherends can be fixed with a good adhesive strength even under a high-temperature state and when the fixed assembly is subjected to a heat cycle of quick heating and quick cooling, a stable adhesive strength can be maintained without causing peeling and deterioration.

Electronic parts which can be fixed by adhesion include IC chips, hybrid packages, multichip nodules, power transistors, closed-type integrated circuits with plastics or metals, etc. The present invention can be advantageously applied to fix by adhesion electronic parts having a large heating value, such as highly integrated circuits.

Also, heat-radiating members which are other object to be fixed by adhesion include a heat sink composed of a plate or a sheet of the above-described metal illustrated as the base material and other radiators.

The thickness of the heat sink is generally from 10 $\mu$m to 10 mm, preferably from 50 $\mu$m to 5 mm, and more preferably from 100 $\mu$m to 3 mm, although the thickness is not limited to the range. The radiator may have a proper structure such as the form having cooling fins.

In addition, the pressure-sensitive adhesives and the adhesive sheets thereof of the present invention are used not only for fixing by adhesion such electronic parts and heat-radiating members but also for fixing members in other various fields such as building materials, vehicles, airplanes, vessels, etc., with the same effects as described above.

The present invention is described more practically by the following examples. In addition, all parts in these examples, unless otherwise indicated, are by weight.

EXAMPLE 1

A premixture made up of 75 parts of isooctyl acrylate, 20 parts of butyl acrylate, 5 parts of acrylic acid, and 0.1 part of 2,2-dimethoxy-2-phenylacetophenone as a polymerization initiator was partially polymerized by irradiated with ultraviolet rays in a nitrogen gas atmosphere to provide a coatable syrup having a viscosity of about 4,000 c.p. By mixing 100 parts of the syrup with 0.2 part of trimethylolpropane triacrylate as a crosslinking agent and 40 parts of hexagonal boron nitride (h-BN) as a ceramic powder, a composition was prepared. In addition, the thermal expansion coefficient (room temperature→1000° C.) of the hexagonal boron nitride (h-BN) was 0.1×10$^{-5}$/° C.

The composition was coated on a polyester film subjected to a surface treatment with a releasing agent, photopolymerized by irradiating with ultraviolet rays of 900 mj/cm$^2$ from a high-pressure mercury lamp having an intensity of 5 mW/cm$^2$ in a nitrogen gas atmosphere followed by heat-drying in a hot-air circulation dryer at 130° C. for 5 minutes to form the layer of a pressure-sensitive adhesive made up of the photopolymerization product having a thickness of 50 $\mu$m. Then, by transferring the layer onto both surfaces of an aluminum foil having a thickness of 30 $\mu$m, an adhesive sheet was prepared.

EXAMPLE 2

An adhesive sheet was prepared in the same manner as in Example 1 except that the amount of the hexagonal boron nitride (h-BN) was changed to 120 parts.

EXAMPLE 3

A coatable syrup having a viscosity of about 4,000 c.p. was obtained by following the same procedure as in Example 1 using a premixture made up of 80 parts of 2-ethylhexyl acrylate, 19 parts of butyl acrylate, 1 part of acrylic acid, and 0.1 part of 2,2-dimethoxy-2-phenylactophenone. By mixing 100 parts of the syrup with 0.2 part of trimethylolpropane triacrylate and 40 parts of SiC, a covalent bond substance having the total valence electron number of 8, as a ceramic powder, a composition was prepared. In addition, the thermal expansion coefficient (room temperature→1,000° C.) of above-described SiC was 0.6×10$^{-5}$/° C.

The composition was coated on a polyester film subjected to a surface treatment with a releasing agent, photopolymerized by irradiating with ultraviolet rays of 900 mj/cm$^2$ from a high-pressure mercury lamp having an intensity of 5 mW/cm$^2$ in a nitrogen gas atmosphere followed by heat-drying in a hot-air circulation dryer at 130° C. for 5 minutes to form the layer of a pressure-sensitive adhesive made up of the photopolymerization product having a thickness of 50 $\mu$m. Then, the layer was transferred onto both surfaces of a copper foil having a thickness of 35 $\mu$m to thereby obtain an adhesive sheet.

EXAMPLE 4

An adhesive sheet was prepared in the same manner as in Example 3 except that 40 parts of AlN as a covalent bond substance having the total electron number of 8 was used as a ceramic powder in place of SiC as a covalent bond substance having the total valence electron number of 8. The thermal expansion coefficient of AlN (room temperature→1,000° C.) was 4.0×10$^{-5}$/° C.

Comparative Example 1

An adhesive sheet was prepared in the same manner as in Example 1 except that the use of 40 parts of the hexagonal boron nitride (h-BN) was omitted.

Comparative Example 2

An adhesive sheet was prepared in the same manner as in Example 1 except that 40 parts of Al$_2$O$_3$ as an ion bonding substance was used as a ceramic powder in place of 40 parts of the hexagonal boron nitride (h-BN). The thermal expansion coefficient (room temperature→1,000° C.) of above-described Al$_2$O$_3$ was 6.0×10$^{-5}$/° C.

Comparative Example 3

By carrying out a solution polymerization of 75 parts of isononyl acrylate, 20 parts of butyl acrylate, and 5 parts of acrylic acid in 210 parts of ethyl acetate in the presence of 0.4 part of 2,2'-azobis-isobutyronitrile with stirring at a temperature of from 60 to 80° C. in a nitrogen gas atmosphere, a polymer solution having a viscosity of 120 poise, a polymerization ratio of 99.2% by weight and a solid component ratio of 30.0% by weight was obtained. By mixing 100 parts of the polymer solution with 3 parts of a polyfunctional isocyanate compound as a crosslinking agent and 40 parts of hexagonal boron nitride (h-BN) as a ceramic powder, a pressure-sensitive adhesive solution was prepared.

The pressure-sensitive adhesive solution was coated on a polyester film subjected to a surface treatment with a releasing agent and after heat-drying in a hot-air circulation dryer at 40° C. for 5 minutes, was further dried at 130° C. for 5 minutes to form the layer of the pressure-sensitive adhesive having a thickness of 50 $\mu$m. Then, the layer was transferred onto both surfaces of an aluminum foil having a thickness of 30 $\mu$m to thereby obtain an adhesive sheet.

Then, each of the adhesive sheets prepared in Examples 1 to 4 and Comparison Examples 1 to 3 described above was subjected to a heat-resisting shearing retention force test, a cooling-heating cycle shearing retention force test, and a heat resistance test by the following methods. The results are shown in Table 1 below.

Heat-resisting Shearing Retention Force Test

Each adhesive sheet (10 mm width) was adhered to one end of the lengthwise direction of an aluminum plate (125 mm×25 mm×0.4 mm) such that the adhered area became 20 mm×10 mm, after allowing stand for 30 minutes at 80° C., a load of 500 g was applied to the lengthwise direction of the adhered area at 80° C., and whether or not the adhesive sheet was retained without falling for 120 minutes or longer was tested. As the test results, the case of being retained was evaluated as "A" and the case of being not retained was evaluated as "B".

Cooling-heating Cycle Shearing Retention Fore Test

In the same manner as in the heat-resisting shearing retention force test, each adhesive sheet (10 mm width) was adhered, after allowing to stand for 30 minutes at 80° C., a load of 500 g was applied. When the surrounding conditions were changed from 80° C. for 60 minutes to 0° C. for 60 minutes, furthermore, to 80° C. for 60 minutes, and thereafter to 0° C. for 60 minutes, whether or not the adhesive sheet was retained without falling was tested. As the test results, the case of retained was evaluated as "A" and the case of not retained was evaluated as "B".

Heat Resistance Test

A transistor in a TO-220 package (according to the standard of JEDEC) was fixed by adhesion to a heat sink, the temperature thereof became constant by immersing in water, using each adhesive sheet, thereafter, a definite output was supplied to the transistor, and the temperature difference $(T_2-T_1)$ of the temperature $(T_2)$ of the transistor and the surface temperature $(T_1)$ at the lower side of the adhesive sheet was measured. From the temperature difference, the heat resistance was calculated by the following equation.

Heat resistance (° C.cm²/W)=$(T_2-T_1)$ x A/P

A: Area of the transistor (cm²)

P: Consumed electric power (W) of the transistor

In addition, the temperature $(T_2)$ of the transistor was measured by a thermocouple spot-welded to the metal base portion of the transistor package. Also, the surface temperature $(T_1)$ at the lower side of the adhesive sheet was measured by making a small hole in the heat sink and inserting a thermocouple in the hole. In this case, the thermocouple was placed in the heat sink disposed at the interface between the heat sink and the adhesive sheet as near as possible so that the adhered area was not influenced.

TABLE 1

|  | Heat-Resisting Shearing Retention Force Test | Cooling · Heating Cycle Shearing Retention Force Test | Heat-Resistance Test |
| --- | --- | --- | --- |
| Example 1 | A | A | 3.3 |
| Example 2 | A | A | 2.3 |
| Example 3 | A | A | 5.5 |
| Example 4 | A | A | 5.0 |
| Comparative Example 1 | A | A | 15 |
| Comparative Example 2 | A | B | 7.5 |
| Comparative Example 3 | B | B | 3.3 |

From the results shown in the above table, it can be seen that the adhesive sheets-of the present invention in Examples 1 to 4 satisfy the heat-resisting shearing retention force test and the cooling-heating shearing retention force test, are excellent in the heat resistance, do not have a possibility of causing problems of peeling and deterioration when they are subjected to the heat cycle of quick cooling and quick cooling, have a low heat resistance, and are excellent in the heat conductivity.

On the other hand, in the adhesive sheet in Comparative Example 1 without adding a ceramic powder and the adhesive sheet in Comparative Example 2 using $Al_2O_3$, which is an ion-bonding substance, as a ceramic powder, the heat resistance cannot be reduced to those of the adhesive sheets of the present invention, and also the adhesive sheet in Comparative Example 2 is inferior in the cooling-heating shearing retention force test. Also, in the adhesive sheet in Comparative Example 3, wherein the same ceramic powder as that in the present invention is added to the pressure-sensitive adhesive which is not of a photopolymerization type but is of an organic solvent solution type, the heat resistance can be sufficiently reduced but the adhesive sheet cannot satisfy the heat-resisting shearing retention force test and the cooling-heating cycle shearing retention test.

INDUSTRIAL APPLICABILITY

As described above, in the present invention, by employing the constitution that a specific ceramic powder is incorporated in a photopolymerization type pressure-sensitive adhesive, the pressure-sensitive adhesive excellent in the heat resistance and the heat conductivity and the adhesive sheets thereof can be obtained. Also, by these adhesive materials, electronic parts and heat-radiating members can be easily fixed without requiring a much time and a large labor for the adhering treatment, peeling or deterioration is not caused, even when the adhesive materials are subjected to a heat cycle of quick heating and quick cooling, and the objects to be fixed can be stably maintained. Furthermore, the adhesive materials of the present invention are not limited for the use of fixing electronic parts or members but can be widely utilized for the uses of fixing requiring a high heat resistance and a high heat conductivity, such as building materials, vehicles, airplanes, vessels, etc.

What is claimed is:

1. A pressure-sensitive adhesive excellent in heat resistance and heat-conductivity comprising a photopolymerization product of a composition containing following four components a) to d):

a) 100 parts by weight of a monomer mixture (or a partial polymerization product thereof) made up of from 70 to 99% by weight of a (meth) acrylic acid alkyl ester wherein the carbon atom number of the alkyl group is from 2 to 14 on an average and from 30 to 1% by weight of a monoethylenically unsaturated monomer copolymerizable with the (meth)acrylic acid alkyl ester, b) from 0.01 to 5 parts by weight of a polyfunctional (meth)acrylate as a crosslinking agent, c) from 10 to 300 parts by weight of at least one kind of a ceramic powder selected from a covalent bond substance having a total valence electron number of 8 and having a wurtzite-type or zincblende-type crystal structure and a substance having a hexagonal system or graphite structure, and d) from 0.01 to 5parts by weight of a photopolymerization initiator.

2. A pressure-sensitive adhesive of claim 1, wherein the thermal expansion coefficient of the ceramic powder of the component c) is $5.0 \times 10^{-5}/°$ C. or lower.

3. An adhesive sheet comprising a base material having formed on one surface or both surfaces thereof the layer of a pressure-sensitive adhesive excellent in heat resistance and heat-conductivity comprising a photopolymerization product of a composition containing following four components a) to d):

a) 100 parts by weight of a monomer mixture (or the partial polymerization product thereof) made up of from 70 to 99% by weight of a (meth) acrylic acid alkyl ester wherein the carbon atom number of the alkyl group is from 2 to 14 on an average and from 30 to 1% by weight of a monoethylenically unsaturated monomer copolymerizable with the (meth)acrylic acid alkyl ester, b) from 0.01 to 5 parts by weight of a polyfunctional (meth)acrylate as a crosslinking agent, c) from 10 to 300 parts by weight of at least one kind of a ceramic powder selected from a covalent bond substance having a total valence electron number of 8 and having a wurtzite-type or zincblende-type crystal structure and a substance having a hexagonal system or graphite structure, and d) from 0.01 to 5 parts by weight of a photopolymerization initiator.

4. An adhesive sheet of claim 3, wherein the thermal expansion coefficient of the ceramic powder of the component c) is $5.0 \times 10^{-5}/^\circ$ C. or lower.

5. An adhesive sheet of claim 3, wherein the base material is made up of a material excellent in heat resistance and heat-conductivity.

6. An adhesive sheet of claim 5, wherein the base material is made up of a metal foil.

7. A fixing method of electronic parts and heat-radiating members, which comprising fixing by adhesion electronic parts and heat-radiating members via a pressure-sensitive adhesive excellent in heat resistance and heat-conductivity comprising a photopolymerization product of a composition containing following four components a) to d):

a) 100 parts by weight of a monomer mixture (or the partial polymerization product thereof) made up of from 70 to 99% by weight of a (meth) acrylic acid alkyl ester wherein the carbon atom number of the alkyl group is from 2 to 14 on an average and from 30 to 1% by weight of a monoethylenically unsaturated monomer copolymerizable with the (meth)acrylic acid alkyl ester, b) from 0.01 to 5 parts by weight of a polyfunctional (meth)acrylate as a crosslinking agent, c) from 10 to 300 parts by weight of at least one kind of a ceramic powder selected from a covalent bond substance having a total valence electron number of 8 and having a wurtzite-type or zincblende-type crystal structure and a substance having a hexagonal system or graphite structure, and d) from 0.01 to 5 parts by weight of a photopolymerization initiator.

8. A fixing method of electronic parts and heat-radiating members of claim 7, wherein the thermal expansion coefficient of the ceramic powder of the component c) is $5.0 \times 10^{-5}/^\circ$ C. or lower.

9. A fixing method of electronic parts and heat-radiating members, which comprises fixing by adhesion electronic parts and heat-radiating members via an adhesive sheet having formed thereon the layer of a pressure-sensitive adhesive excellent in heat resistance and heat-conductivity comprising a photopolymerization product of a composition containing following four components a) to d):

a) 100 parts by weight of a monomer mixture (or the partial polymerization product thereof) made up of from 70 to 99% by weight of a (meth) acrylic acid alkyl ester wherein the carbon atom number of the alkyl group is from 2 to 14 on an average and from 30 to 1% by weight of a monoethylenically unsaturated monomer copolymerizable with the (meth)acrylic acid alkyl ester, b) from 0.01 to 5 parts by weight of a polyfunctional (meth)acrylate as a crosslinking agent, c) from 10 to 300 parts by weight of at least one kind of a ceramic powder selected from a covalent bond substance having a total valence electron number of 8 and having a wurtzite-type or zincblende-type crystal structure and a substance having a hexagonal system or graphite structure, and d) from 0.01 to 5parts by weight of a photopolymerization initiator.

10. A fixing method of electronic parts and heat-radiating members of claim 9, wherein the thermal expansion coefficient of the ceramic powder of the component c) is $5.0 \times 10^{-5}/^\circ$ C. or lower.

11. A fixing method of electronic parts and heat-radiating members of claim 9, wherein the base material is made up of a material excellent in heat resistance and conductivity.

12. A fixing method of electronic parts and heat-radiating members of claim 11, wherein the base material is made up of a metal foil.

\* \* \* \* \*